US009384988B2

(12) United States Patent
Lin et al.

(10) Patent No.: US 9,384,988 B2
(45) Date of Patent: Jul. 5, 2016

(54) GATE PROTECTION CAPS AND METHOD OF FORMING THE SAME

(71) Applicant: Taiwan Semiconductor Manufacturing Company, Ltd., Hsin-Chu (TW)

(72) Inventors: Chih-Han Lin, Hsin-Chu (TW);
Jr-Jung Lin, Hsin-Chu (TW);
Ming-Ching Chang, Hsin-Chu (TW);
Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 14/084,420

(22) Filed: Nov. 19, 2013

(65) Prior Publication Data
US 2015/0137195 A1 May 21, 2015

(51) Int. Cl.
*H01L 21/28* (2006.01)
*H01L 21/8234* (2006.01)
*H01L 21/8238* (2006.01)
*H01L 29/423* (2006.01)
*H01L 29/66* (2006.01)

(52) U.S. Cl.
CPC ..... *H01L 21/28247* (2013.01); *H01L 21/28008* (2013.01); *H01L 21/823437* (2013.01); *H01L 21/823468* (2013.01); *H01L 21/823864* (2013.01); *H01L 29/4232* (2013.01); *H01L 29/6656* (2013.01); *H01L 29/66545* (2013.01)

(58) Field of Classification Search
CPC ....... H01L 29/78; H01L 21/336; H01L 21/28; H01L 29/423; H01L 29/812; H01L 29/205; H01L 29/66863; H01L 29/4958; H01L 29/4966; H01L 29/66; H01L 21/823468; H01L 21/823437; H01L 21/823864; H01L 21/28008
USPC .......... 257/288, 410, E21.409, E29.255, 257/E21.19, E29.128, 76, 192, 183; 438/785, 775, 197, 585, 586
See application file for complete search history.

(56) References Cited

U.S. PATENT DOCUMENTS

| | | | |
|---|---|---|---|
| 6,258,729 B1 * | 7/2001 | DeBoer et al. | 438/745 |
| 6,777,299 B1 * | 8/2004 | Chiu et al. | 438/303 |
| 7,563,701 B2 | 7/2009 | Chang et al. | |
| 7,759,262 B2 * | 7/2010 | King et al. | 438/785 |
| 2009/0289334 A1 * | 11/2009 | Rachmady | H01L 21/28079 257/649 |
| 2012/0220097 A1 * | 8/2012 | Zhong et al. | 438/300 |
| 2013/0277764 A1 * | 10/2013 | Li | H01L 29/517 257/410 |

\* cited by examiner

*Primary Examiner* — Armando Rodriguez
(74) *Attorney, Agent, or Firm* — Slater Matsil, LLP

(57) ABSTRACT

A structure includes a substrate, a gate structure over the substrate, a dielectric layer over the substrate, and a cap over a gate electrode of the gate structure. Top surfaces of the dielectric layer and gate electrode are co-planar. The gate structure extends a gate lateral distance between first and second gate structure sidewalls. The cap extends between first and second cap sidewalls. A first cap portion extends from a midline of the gate structure laterally towards the first gate structure sidewall and to the first cap sidewall a first cap lateral distance, and a second cap portion extends from the midline laterally towards the second gate structure sidewall and to the second cap sidewall a second cap lateral distance. The first cap lateral distance and the second cap lateral distance are at least half of the gate lateral distance.

18 Claims, 5 Drawing Sheets

GATE PROTECTION CAPS AND METHOD OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. The resulting increased integration density generally has resulted in improved integrated circuits, such as ones having decreased latency. However, the decrease in minimum feature size and increase in density may result in problems in fabricated integrated circuits that can decrease a yield of the integrated circuits.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
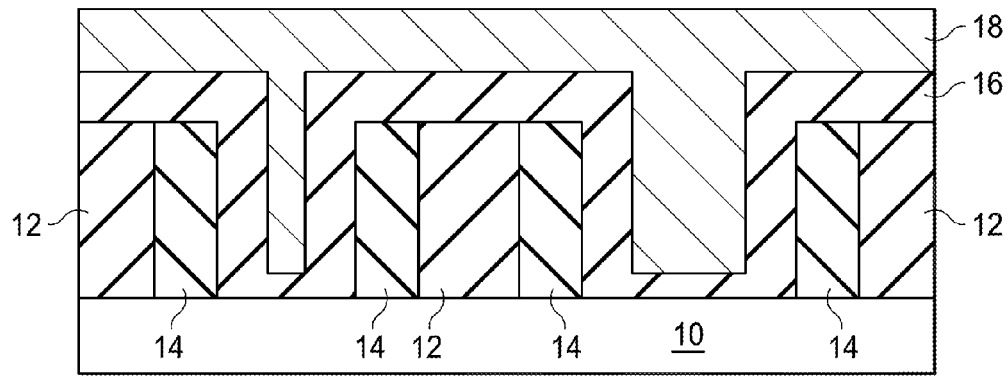
FIGS. 1 through 6 are cross sectional views of forming a gate structure and contact to a substrate according to an embodiment.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a gate-last process in forming a transistor, such as a fin field effect transistor (FinFET). Other embodiments may also be applied, however, to other structures and processes. Like reference numerals refer to like components throughout the figures and following discussion. Although methods discussed herein are described as being performed in a particular order, other method embodiments may be performed in any logical order. Additionally, additional processing steps may be omitted from this disclosure that will be readily apparent to a person having ordinary skill in the art. Such omission is to not obscure features of disclosed embodiments.

FIG. 1 illustrates a structure during a gate-last process according to an embodiment. The structure comprises a substrate 10, a first dielectric layer 12, gate spacers 14, a gate dielectric layer 16, and a gate electrode layer 18. The substrate 10 may be a part of a wafer and may be a semiconductor substrate, which may further be a silicon substrate, a silicon carbon substrate, a silicon germanium substrate, or a substrate formed of other semiconductor materials. The substrate 10 may be a bulk substrate, a semiconductor-on-insulator (SOI) substrate, or other suitable substrates. The substrate 10 may be lightly doped with a p-type or an n-type impurity. The substrate 10 may further comprise a semiconductor fin of a substrate.

A dummy gate dielectric layer may be formed on the substrate 10. The dummy gate dielectric layer may be, for example, silicon oxide, silicon nitride, a combination thereof, or the like, and may be deposited or thermally grown according to satisfactory techniques. A dummy gate layer may be formed over the dummy gate dielectric layer, and a mask layer may be formed over the dummy gate layer. The dummy gate layer may be deposited over the dummy gate dielectric layer and then planarized, such as by a chemical mechanical polish (CMP). The mask layer may be deposited over the dummy gate layer. The mask layer then may be patterned using satisfactory photolithography and etching techniques. The pattern of the mask then may be transferred to the dummy gate layer by a satisfactory etching technique. These photolithography and etching techniques may form the dummy gates and mask. The dummy gates may be formed of, for example, polysilicon, although other materials may also be used. The mask may be formed of, for example, silicon nitride or the like. The dummy gates cover respective channel regions of the substrate 10, such as channel regions in fins of the substrate 10.

Gate seal spacers can be formed on exposed surfaces of respective dummy gates. A thermal oxidation or a deposition followed by an anisotropic etch may form the gate seal spacers. Gate spacers 14 are formed on the gate seal spacers along sidewalls of the dummy gates. The gate spacers 14 may be formed by conformally depositing a material and subsequently anisotropically etching the material. The material of the gate spacers 14 may be silicon nitride, SiCN, a combination thereof, or the like. The masks may be removed, for example, by an etch selective to the material of the masks. An etch stop layer (not explicitly shown) may be conformally deposited over the substrate 10, dummy gate, and gate spacers 14, and a first dielectric layer 12, such as an Inter-Layer Dielectric (ILD), is deposited over the etch stop layer. The etch stop layer may be silicon nitride, SiON, SiCN, a combination thereof, and the like. The first dielectric layer 12 may be formed of a dielectric material such as Phospho-Silicate Glass (PSG), Boro-Silicate Glass (BSG), Boron-Doped Phospho-Silicate Glass (BPSG), undoped Silicate Glass (USG), spin-on-glass, fluorinated silica glass (FSG), carbon doped silicon oxide (e.g., SiCOH), or the like. The first dielectric layer 12 may be formed by chemical vapor deposition (CVD), high density plasma (HDP) CVD, sub-atmospheric CVD (SACVD), spin-on, sputtering, or other suitable methods.

A CMP may be performed to level the top surface of first dielectric layer 12 with the top surfaces of the dummy gates and gate spacers 14. The CMP may also remove portions of the etch stop layer that are above the dummy gates. Accordingly, top surfaces of the dummy gates are exposed through the first dielectric layer 12 and the etch stop layer.

The dummy gates, gate seal spacers, and the dummy gate dielectric underlying the dummy gates are removed in an etching step(s), so that recesses are formed between the gate spacers 14. During the removal, the dummy gate dielectric may be used as an etch stop layer when the dummy gates are etched. The dummy gate dielectric and gate seal spacers may then be removed after the removal of the dummy gates.

FIG. 1 illustrates the formation of gate dielectric layer 16 and gate electrode layer 18. Gate dielectric layer 16 is deposited conformally in recesses between the gate spacers 14, such as on the surfaces of the substrate 10 and on interior sidewalls of the gate spacers 14, and on a top surface of the first dielectric layer 12. In accordance with some embodiments, gate dielectric layer 16 comprises silicon oxide, silicon nitride, or multilayers thereof. In other embodiments, gate dielectric layer 16 comprises a high-k dielectric material, and in these embodiments, gate dielectric layer 16 may have a k value greater than about 7.0, and may include a metal oxide or a silicate of Hf, Al, Zr, La, Mg, Ba, Ti, Pb, and combinations thereof. The formation methods of gate dielectric layer 16 may include Molecular-Beam Deposition (MBD), Atomic Layer Deposition (ALD), Plasma Enhanced CVD (PECVD), and the like. Next, gate electrode layer 18 is deposited over gate dielectric layer 16, and fills the remaining portions of the recesses. Gate electrode layer 18 may comprise a metal-containing material such as TiN, TaN, TaC, Co, Ru, Al, combinations thereof, or multi-layers thereof. The gate electrode layer 18 may be formed by CVD, physical vapor deposition (PVD), a plating process, the like, or a combination thereof.

Figure 2:
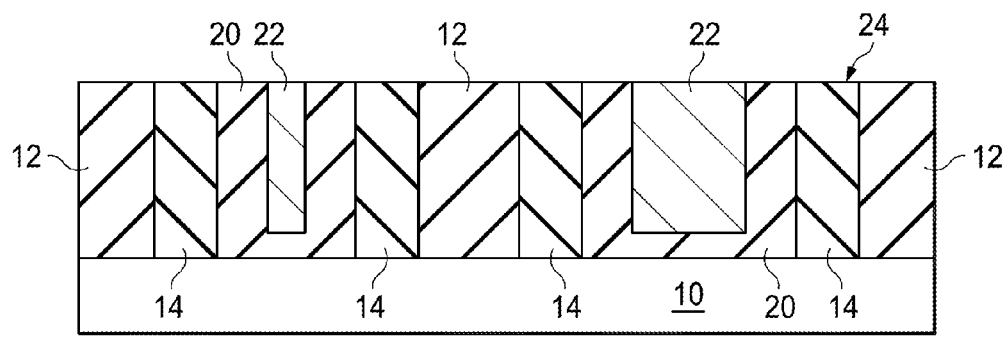

In FIG. 2, excess materials of the gate dielectric layer 16 and the gate electrode layer 18 are removed to form gate structures, with each including a gate dielectric 20 and a gate electrode 22. The removal of the excess materials may result in the gate structures having respective top surfaces that are co-planar with the top surface of the first dielectric layer 12. Plane 24 illustrates these co-planar top surfaces. The excess materials may be removed by a CMP, which may also create the respective top surfaces of the gate structures and the first dielectric layer 12 to be co-planar.

Figure 3:
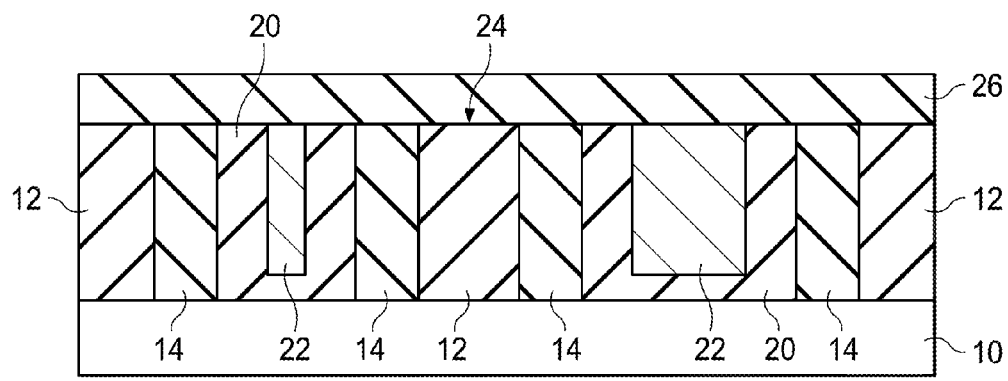

In FIG. 3, a protection layer 26 is formed over the first dielectric layer 12, the gate spacers 14, the gate dielectrics 20, and the gate electrodes 22, such as over and adjoining plane 24. The protection layer 26 may have a thickness between about 5 Å and about 5,000 Å. The protection layer 26 may comprise silicon nitride, silicon oxynitride, silicon carbon nitride, the like, or a combination thereof, and may be formed using CVD, PECVD, the like, or a combination thereof. The material of the protection layer 26 may be different than the material of the first dielectric layer 12, such that the material of the protection layer 26 has a different etch selectivity than the first dielectric layer 12. Hence, the protection layer 26 may provide a mechanism to stop an etching process when forming a contact to the substrate 10.

Figure 4:
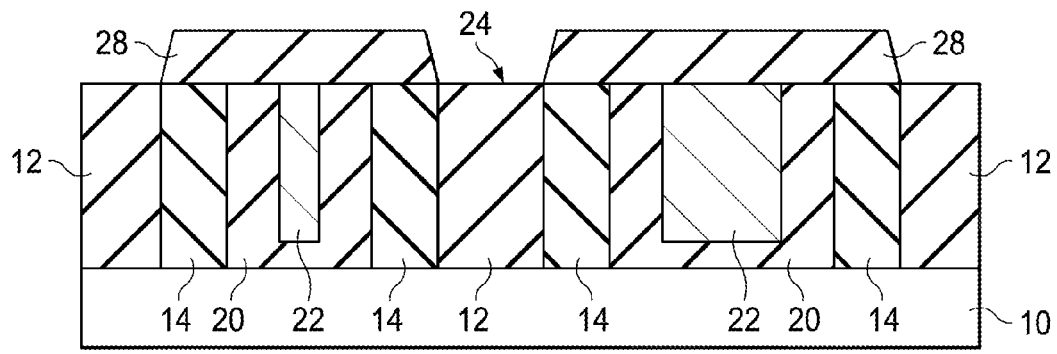

In FIG. 4, the protection layer 26 is etched to form gate protection caps 28 over respective gate structures, such as over the gate dielectrics 20 and the gate electrodes 22. An suitable photolithography and etching process may be used to form the gate protection caps 28. For example, a photoresist may be formed and patterned over the protection layer 26, and then, the pattern of the photoresist may be transferred to the protection layer 26 by an etch process to form the gate protection caps 28. The etching process may be a reactive ion etching (RIE), inductively coupled plasma (ICP) etch, capacitively coupled plasma (CCP), the like or a combination thereof. Further, the etching process may use a fluorine-based gas(es), such as $CF_4$, $C_4F_8$, $C_5F_8$, $CH_3F$, or the like, as an etchant.

Figure 5:
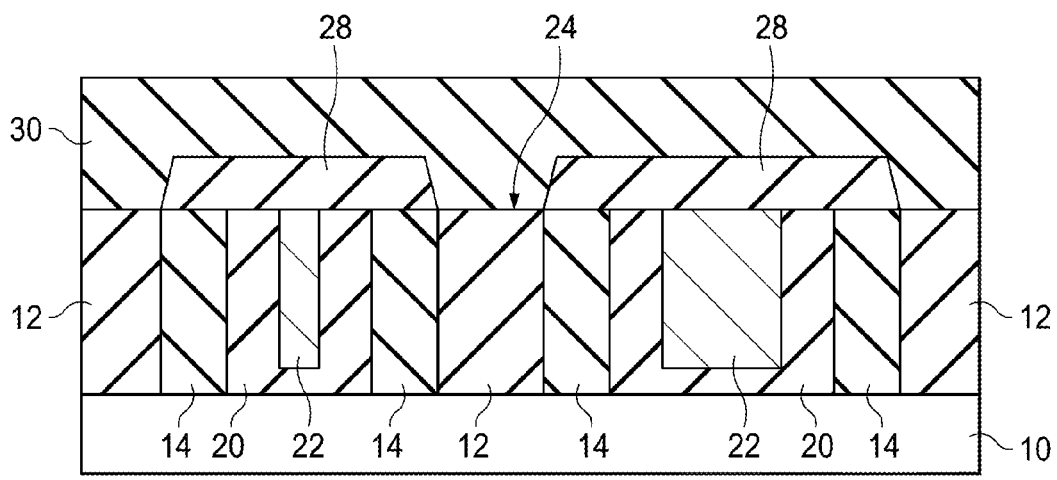

In FIG. 5, a second dielectric layer 30 is formed over the first dielectric layer 12 and the protection caps 28. The second dielectric layer 30 may be formed of a dielectric material such as PSG, BSG, BPSG, USG, spin-on-glass, FSG, carbon doped silicon oxide (e.g., SiCOH), or the like. The second dielectric layer 30 may be formed by CVD, HDP-CVD, SACVD, spin-on, sputtering, or other suitable methods.

Figure 6:
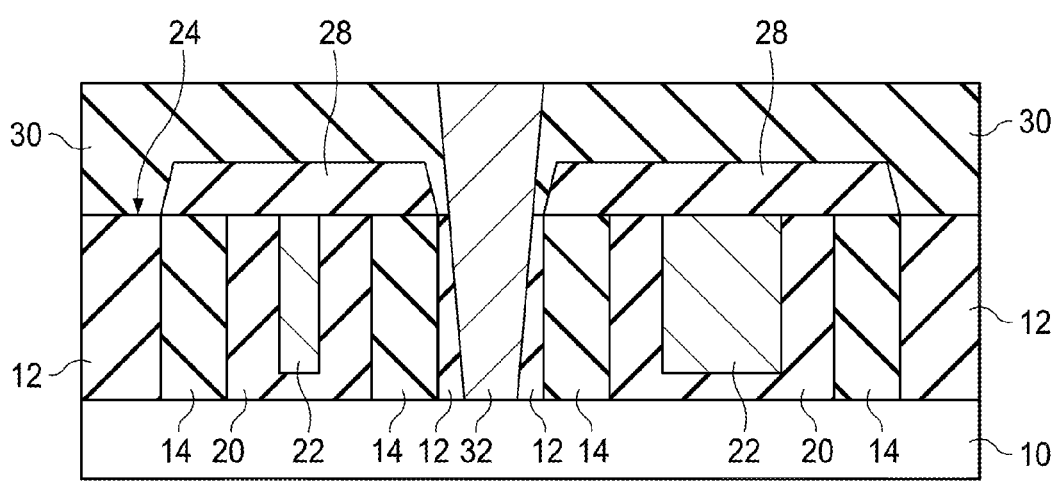

In FIG. 6, a contact 32 is formed through the second dielectric layer 30 and first dielectric layer 12 to the substrate 10. An opening may be formed in the second dielectric layer 30 and first dielectric layer 12 to the substrate 10, such as by forming a layer of photoresist over the first dielectric layer 12, patterning the layer of photoresist to form a patterned photoresist feature by a proper lithography method, and etching the exposed second dielectric layer 30 through the first dielectric layer 12. The patterned photoresist layer may be stripped thereafter. A conductive material is then formed in the opening. Conductive material may be formed of a combination of low resistance pure metal on a diffusion barrier. For example, the diffusion barrier may be formed of Ti, TiN, Ta, TaN, Co, Ru, and the like, and the conductive material may be formed of tungsten, copper, silver, aluminum, compounds thereof, and the like. The diffusion barrier and the conductive material may be formed by ALD, CVD, PVD, a plating process, the like, or a combination thereof. A planarization, such as a CMP, may be performed to remove excess conductive material.

Figure 7:
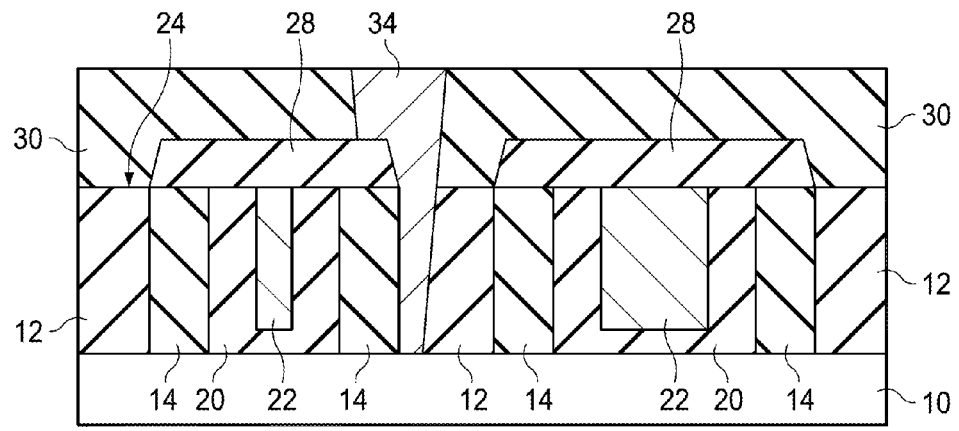
FIG. 7 is a misaligned contact according to an embodiment.

FIG. 7 illustrates a misaligned contact 34. FIG. 6 illustrates a contact 32 that may be formed assuming a proper alignment of a photolithography mask used in defining an opening of the contact 32 and certain precision during other processing. During processing, some misalignment of photolithography mask(s) or other imprecision in creating structures may occur. Accordingly, FIG. 7 illustrates an example where misalignment or other processing imprecision leads to an overlay of the contact 34 with a gate structure. The presence of the protection cap 28 over the gate structure may prevent a failure of the device, such as an improper electrical connection to the gate electrode 22 and/or a short between the gate electrode 22 and a source/drain region in the substrate 10, such as a source/drain region of a transistor that comprises the gate structure.

Figure 8A:
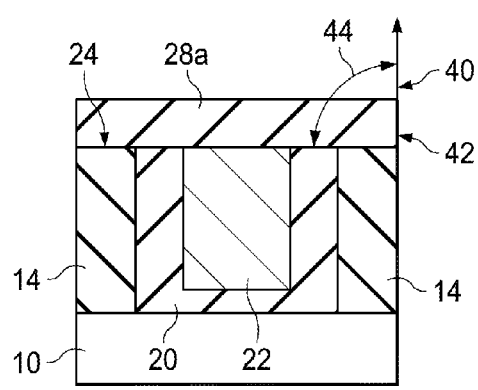
FIGS. 8A through 8C are various profiles of example gate protection caps according to embodiments.
Figure 8B:
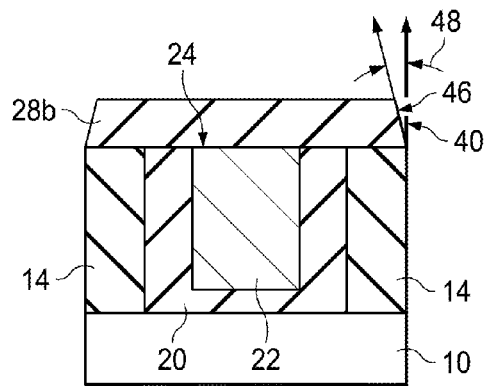
Figure 8C:
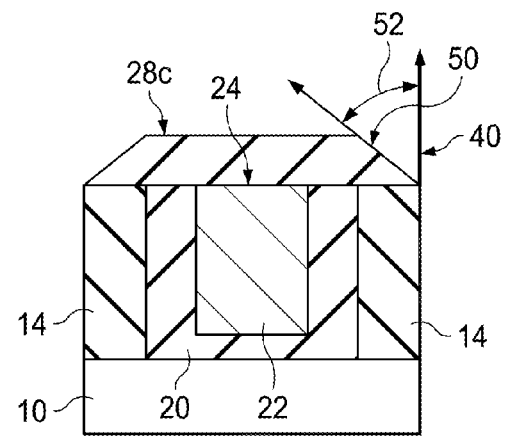

FIGS. 8A through 8C illustrate various profiles of example gate protection caps 28a, 28b, and 28c. The example gate protection caps 28a, 28b, and 28c may be formed during the step discussed with respect to FIG. 4. In FIG. 8A, the gate protection cap 28a has a substantially vertical sidewall 42, which is substantially parallel to direction 40 that is orthogonal 44 to plane 24. The substantially vertical sidewall 42 may be formed using an anisotropic etching process. In FIG. 8B, the gate protection cap 28b is mildly tapered inward in a direction extending distally from the plane 24, and the gate protection cap 28b has a mildly sloped sidewall 46. The mildly sloped sidewall 46 forms an angle 48 with the direction 40 that is orthogonal to plane 24. The angle 48 may be greater than zero and equal to or less than 30°. For example, the mildly sloped sidewall 46 may form an angle with the plane 24 that is greater than or equal to 60° and less than 90°. In FIG. 8C, the gate protection cap 28c is severely tapered inward in a direction extending distally from the plane 24, and the gate protection cap 28c has a severely sloped sidewall 50. The severely sloped sidewall 50 forms an angle 52 with the direction 40 that is orthogonal to plane 24. The angle 52 may be greater than 30°, such as greater than 30° and equal to or less than about 60°. For example, the severely sloped sidewall 50 may form an angle with the plane 24 that is less than 60°, such as greater than or equal to about 30° and less than 60°. The various sidewalls 42, 46, and 50 may be formed, for example, by controlling a flow rate of a fluorine-based gas during an etching process, such as that discussed with respect to FIG. 4.

Figure 9A:
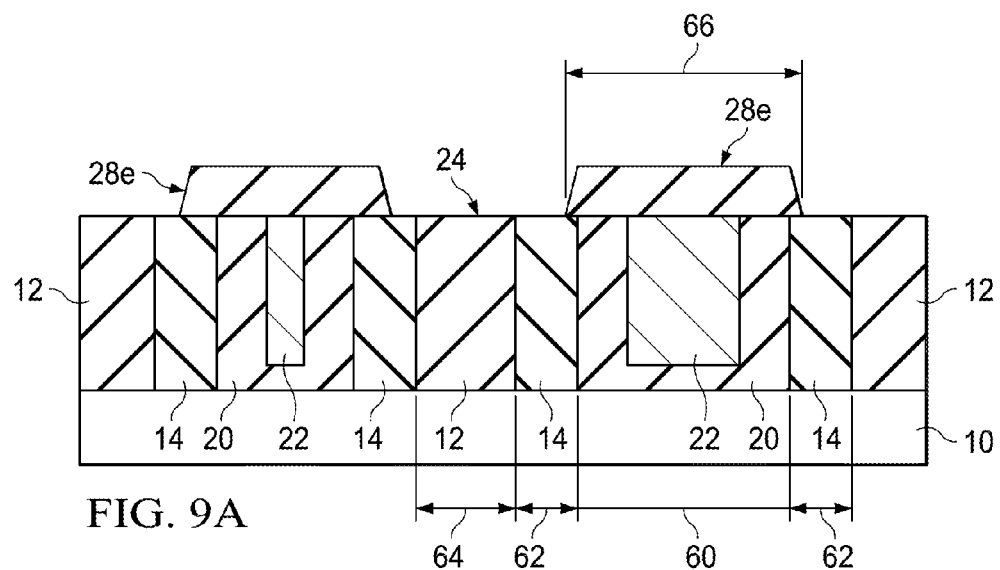
FIGS. 9A through 9C are modifications for example profiles of gate protection caps according to embodiments.
Figure 9B:
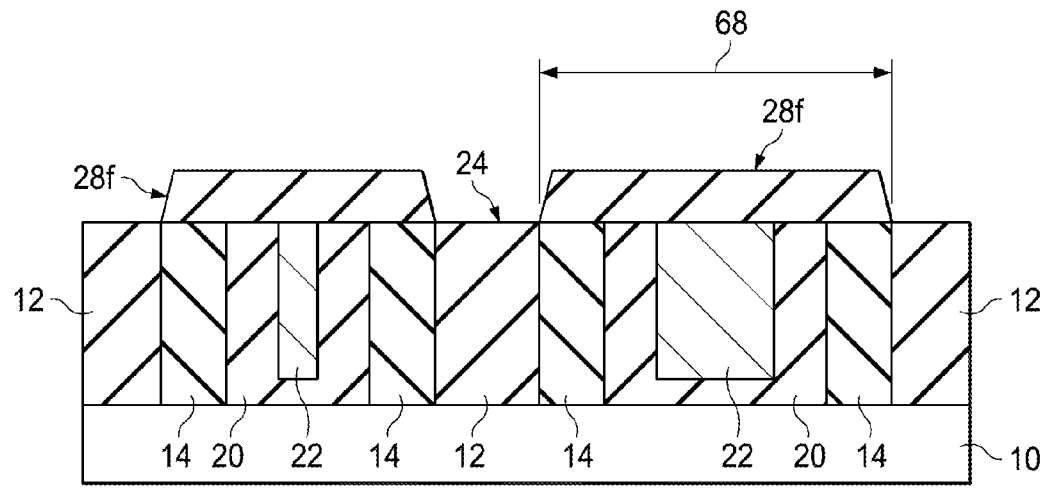
Figure 9C:
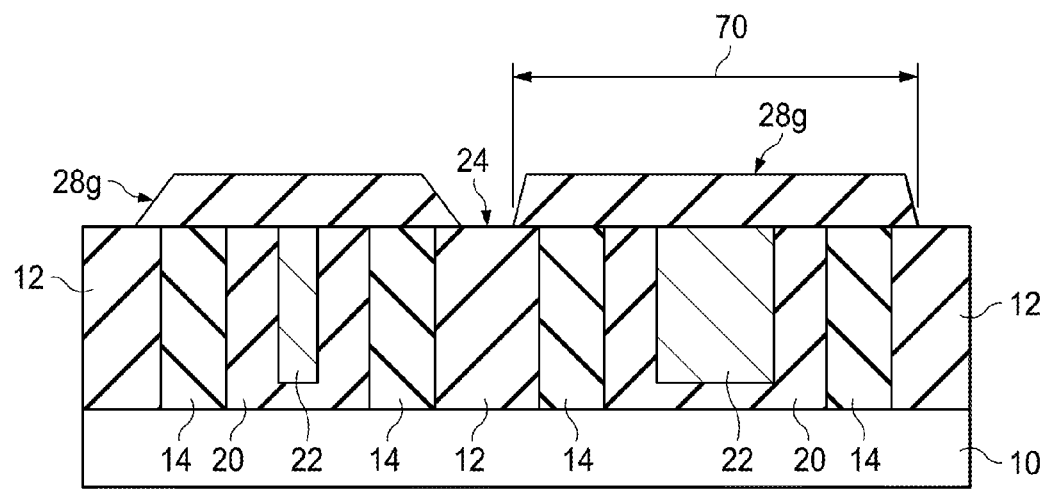

FIGS. 9A through 9C illustrate further modifications for example profiles of gate protection caps 28e, 28f, and 28g. These figures illustrate various lateral dimensions. Unless noted otherwise, the various lateral dimensions are parallel lateral dimensions, and discussion of a lateral dimension of a first structure discussed in relation to another lateral dimension of a second structure are understood to be in relation to corresponding structures, such as a gate structure and its overlying gate protection cap 28.

FIG. 9A illustrates a gate lateral dimension 60, a spacer lateral dimension 62, a gap lateral dimension 64, and a cap lateral dimension 66. The gate lateral dimension 60 is illustrated as being a lateral dimension between opposing interior sidewalls of gate spacers 14. The spacer lateral dimension 62 is illustrated as a lateral dimension between sidewalls of a gate spacer 14. The gap lateral dimension 64 is illustrated as a lateral dimension between opposing sidewalls of gate spacers 14 of neighboring gate structures. The cap lateral dimension 66 is illustrated in a lateral direction between outermost edges of the gate protection cap 28e.

The cap lateral dimension 66 is illustrated as greater than or equal to the gate lateral dimension 60. Further, in this example, the cap lateral dimension 66 is less than the gate lateral dimension 60 plus two times the spacer lateral dimension 62. In an example, a first portion of the gate protection cap 28e extends from a center or midline of the top surface of a gate electrode 22 and to a lateral dimension of equal to or greater than half of the gate lateral dimension 60 and less than a spacer lateral dimension 62 plus half of the gate lateral dimension 60. A second portion of the gate protection cap 28e extends from the center or midline of the top surface of the gate electrode 22, in a lateral direction opposite to that of the first portion of the gate protection cap 28e, and to a lateral dimension of equal to or greater than half of the gate lateral dimension 60 and less than a spacer lateral dimension 62 plus half of the gate lateral dimension 60.

FIG. 9B illustrates a cap lateral dimension 68 of gate protection cap 28f. The cap lateral dimension 68 is illustrated in a lateral direction between outermost edges of the gate protection cap 28f. The cap lateral dimension 68 is illustrated as being equal to the lateral dimension of gate lateral dimension 60 plus two times the spacer lateral dimension 62. In an example, a first portion of the gate protection cap 28f extends from a center or midline of the top surface of a gate electrode 22 and to a lateral dimension of equal to a spacer lateral dimension 62 plus half of the gate lateral dimension 60. A second portion of the gate protection cap 28f extends from the center or midline of the top surface of the gate electrode 22, in a lateral direction opposite to that of the first portion of the gate protection cap 28e, and to a lateral dimension of equal to a spacer lateral dimension 62 plus half of the gate lateral dimension 60.

FIG. 9C illustrates a cap lateral dimension 70 of gate protection cap 28g. The cap lateral dimension 70 is illustrated in a lateral direction between outermost edges of the gate protection cap 28g. The cap lateral dimension 70 is illustrated as being greater than the gate lateral dimension 60 plus two times the spacer lateral dimension 62. For example, the cap lateral dimension 70 may be greater than the gate lateral dimension 60 plus two times the spacer lateral dimension 62 and less than about the gate lateral dimension 60 plus two times the combination of the spacer lateral dimension 62 plus half of the gap lateral dimension 64.

In an example, a first portion of the gate protection cap 28g extends from a center or midline of the top surface of a gate electrode 22 and to a lateral dimension of greater than a spacer lateral dimension 62 plus half of the gate lateral dimension 60. For example, the first portion of the gate protection cap 28g may extend from the center or midline to a lateral dimension of greater than a spacer lateral dimension 62 plus half of the gate lateral dimension 60 and less than about a spacer lateral dimension 62 plus half of a combination of the gate lateral dimension 60 plus the gap lateral dimension 64. A second portion of the gate protection cap 28g extends from the center or midline of the top surface of the gate electrode 22, in a lateral direction opposite to that of the first portion of the gate protection cap 28g, and to a lateral dimension of greater than a spacer lateral dimension 62 plus half of the gate lateral dimension 60. For example, the second portion of the gate protection cap 28g may extend from the center or midline to a lateral dimension of greater than a spacer lateral dimension 62 plus half of the gate lateral dimension 60 and less than about a spacer lateral dimension 62 plus half of a combination of the gate lateral dimension 60 plus the gap lateral dimension 64.

The gate protection caps 28e, 28f, and 28g may be illustrated in FIGS. 9A through 9C as being substantially centered with respect to a top surface of their respective underlying gate electrodes 22. In embodiments, a gate protection cap 28 may vary from being centered. For example, the various first portions and second portions discussed in FIGS. 9A through 9C may be combined in any manner, such that a gate protection cap 28 may or may not be centered with respect to its underlying gate electrode 22. Additionally, any profile illustrated or discussed with respect to FIGS. 9A through 9C may have one or more of the sidewalls discussed with respect to FIGS. 8A through 8C.

Embodiments may achieve advantages. For example, some embodiments may allow for self-alignment of a contact formed to a substrate. A gate protection cap may allow a contact to be formed with reduced likelihood of a bridge between the gate electrode and the substrate. Hence, a higher processing window may be achieved when small pitch technology is being utilized.

An embodiment is a structure comprising a substrate, a gate structure over the substrate, a first dielectric layer over the substrate, and a gate protection cap over a gate electrode of the gate structure. The gate structure comprises the gate electrode and a gate dielectric. A top surface of the first dielectric layer is co-planar with a top surface of the gate electrode. The gate structure extends laterally a gate lateral distance between a first gate structure sidewall and a second gate structure sidewall. The gate protection cap extends laterally between a first cap sidewall and a second cap sidewall. A first cap portion extends from a midline of the gate structure laterally towards the first gate structure sidewall and to the first cap sidewall a first cap lateral distance, and a second cap portion extends from the midline laterally towards the second gate structure sidewall and to the second cap sidewall a second cap lateral distance. The first cap lateral distance and the second cap lateral distance are at least half of the gate lateral distance.

Another embodiment is a structure comprising a semiconductor substrate, a gate electrode disposed over the semiconductor substrate, a gate dielectric disposed between the gate electrode and the semiconductor substrate and disposed along sidewalls of the gate electrode, spacers disposed over the semiconductor substrate and along the exterior sidewalls of the gate dielectric, a first dielectric layer disposed over the semiconductor substrate, and a protection cap over the gate electrode. Respective top surfaces of the first dielectric layer, the gate dielectric, and the gate electrode are a co-planar surface. A gate width is between opposing exterior sidewalls of the gate dielectric. The protection cap has a cap width. The cap width is equal to or greater than the gate width.

A further embodiment is a method comprising forming a first dielectric layer over a substrate, the first dielectric layer having gate spacers; forming a gate dielectric along respective inner sidewalls of the gate spacers and over the substrate; forming a gate electrode over the gate dielectric, wherein the first dielectric layer, gate dielectric, and gate electrode have top surfaces that are co-planar; and forming a gate protection cap over the gate electrode, the gate protection cap having a width that extends laterally at least a first distance between the inner sidewalls of the gate spacers.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a substrate;
   a gate structure over the substrate, the gate structure comprising a gate electrode and a gate dielectric, the gate structure extending laterally a gate lateral distance between a first gate structure outermost sidewall and a second gate structure outermost sidewall;
   a first spacer along the first gate structure outermost sidewall, the first spacer extending laterally a spacer lateral distance from the first gate structure outermost sidewall to a point of the first spacer furthest from the first gate structure outermost sidewall;
   a second spacer along the second gate structure outermost sidewall, the second spacer extending laterally the spacer lateral distance from the second gate structure outermost sidewall to a point of the second spacer furthest from the second gate structure outermost sidewall;
   a first dielectric layer over the substrate, a top surface of the first dielectric layer and a top surface of the gate electrode being co-planar in a first plane, the first spacer being disposed between the first dielectric layer and the gate structure, the second spacer being disposed between the first dielectric layer and the gate structure; and
   a gate protection cap over the gate electrode, the gate protection cap extending laterally between a first cap sidewall and a second cap sidewall, a first cap portion of the gate protection cap extending directly adjoining the first plane from a midline of the gate structure laterally towards a plane of the first gate structure outermost sidewall and to the first cap sidewall a first cap lateral distance, a second cap portion of the gate protection cap extending directly adjoining the first plane from the midline laterally towards a plane of the second gate structure outermost sidewall and to the second cap sidewall a second cap lateral distance, the first cap lateral distance and the second cap lateral distance being at least half of the gate lateral distance, the first cap lateral distance, the second cap lateral distance, or both being at least the spacer lateral distance plus half of the gate lateral distance.

2. The structure of claim 1, wherein one of the first cap lateral distance or the second cap lateral distance is greater than the spacer lateral distance plus half of the gate lateral distance.

3. The structure of claim 1, wherein at least one of the first cap lateral distance, the second cap lateral distance, or a combination thereof is equal to the spacer lateral distance plus half of the gate lateral distance.

4. The structure of claim 1, wherein a respective neighboring gate structure is a respective gap lateral distance from the first spacer and the second spacer, respectively, at least one of the first cap lateral distance, the second cap lateral distance, or a combination thereof is greater than the spacer lateral distance plus half of the gate lateral distance and less than or equal to the spacer lateral distance plus half of the gate lateral distance plus half of the respective gap lateral distance.

5. The structure of claim 1, wherein the first cap sidewall and the second cap sidewall are each perpendicular to the first plane.

6. The structure of claim 1, wherein the first cap sidewall and the second cap sidewall each form an angle with the first plane, the angle being equal to or greater than 60° and less than 90°, the angle being internal to the gate protection cap.

7. The structure of claim 1, wherein the first cap sidewall and the second cap sidewall each form an angle with the first plane, the angle being equal to or greater than 30° and less than 60°, the angle being internal to the gate protection cap.

8. The structure of claim 1 further comprising:
   a second dielectric layer over the first dielectric layer and the gate protection cap; and
   a contact through the second dielectric layer and the first dielectric layer to the substrate.

9. A structure comprising:
   a semiconductor substrate;
   a gate electrode disposed over the semiconductor substrate;
   a gate dielectric disposed between the gate electrode and the semiconductor substrate and disposed along sidewalls of the gate electrode, a gate width being between opposing exterior sidewalls of the gate dielectric;
   spacers disposed over the semiconductor substrate and along the exterior sidewalls of the gate dielectric, each of the spacers having a spacer width, each spacer width extending from the exterior sidewalls of the gate dielectric to points of each spacer furthest from the exterior sidewalls of the gate dielectric;
   a first dielectric layer disposed over the semiconductor substrate, respective top surfaces of the first dielectric layer, the gate dielectric, and the gate electrode being a co-planar surface; and
   a protection cap over the gate electrode, the protection cap directly adjoining the co-planar surface and having a cap width directly adjoining the co-planar surface, the cap width being equal to or greater than the gate width plus two times the spacer width.

10. The structure of claim 9, wherein the cap width is equal to the gate width plus two times the spacer width of the spacers.

11. The structure of claim 9, wherein the cap width is greater than the gate width plus two times the spacer width of the spacers and less than or equal to the gate width plus a space between a neighboring spacer of a neighboring gate structure and one of the spacers plus two times the spacer width of the spacers.

12. The structure of claim 9, wherein the cap width is between a first sidewall of the protection cap and a second sidewall of the protection cap, the first sidewall and the second sidewall being vertical.

13. The structure of claim 9, wherein the cap width is between a first sidewall of the protection cap and a second sidewall of the protection cap, the first sidewall and the second sidewall each forming an angle with the co-planar surface, the angle being equal to or greater than 60° and less than 90°, the angle being internal to the protection cap.

14. The structure of claim 9, wherein the cap width is between a first sidewall of the protection cap and a second sidewall of the protection cap, the first sidewall and the second sidewall each forming an angle with the co-planar surface, the angle being equal to or greater than 30° and less than 60°, the angle being internal to the protection cap.

15. A method comprising:
   forming a first dielectric layer over a substrate, the first dielectric layer having gate spacers;
   forming a gate dielectric along respective inner sidewalls of the gate spacers and over the substrate;
   forming a gate electrode over the gate dielectric, wherein the first dielectric layer, gate dielectric, and gate electrode have top surfaces that are co-planar in a first plane; and
   forming a gate protection cap over the gate electrode, the gate protection cap having a width directly adjoining the first plane that extends laterally at least a first distance between outer sidewalls of the gate spacers, the outer sidewalls of the gate spacers being opposite from the respective inner sidewalls of the gate spacers.

16. The method of claim 15 further comprising:
   forming a second dielectric layer over the first dielectric layer and the gate protection cap; and
   forming a contact through the second dielectric layer and the first dielectric layer to the substrate, the contact not extending through the gate protection cap.

17. The method of claim 15, wherein the forming the gate protection cap comprises:
   depositing a gate protection cap layer over the gate electrode and first dielectric layer; and
   etching the gate protection cap layer to form the gate protection cap, the etching comprising controlling a flow rate of a fluorine-based gas.

18. The method of claim 15, wherein a second distance is between a neighboring spacer of a neighboring gate structure and one of the gate spacers, the width being less than the first distance plus the second distance.

* * * * *